(12) United States Patent
Uhlig et al.

(10) Patent No.: US 7,307,382 B2
(45) Date of Patent: Dec. 11, 2007

(54) FLAT DISPLAY DEVICE INCLUDING AN OVERFLOW BARRIER

(75) Inventors: Albrecht Uhlig, Berlin (DE); Marcus Schaedig, Koenigs Wisterhausen (DE)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/972,533

(22) Filed: Oct. 26, 2004

(65) Prior Publication Data
US 2005/0093441 A1 May 5, 2005

(30) Foreign Application Priority Data
Oct. 30, 2003 (DE) ............... 103 51 195
Feb. 18, 2004 (KR) ............ 10-2004-0010605

(51) Int. Cl.
*H01J 1/62* (2006.01)
(52) U.S. Cl. ............... 313/506; 313/498; 313/504
(58) Field of Classification Search ........ 313/498–509, 313/512, 582–587
See application file for complete search history.

(56) References Cited

U.S. PATENT DOCUMENTS

| 4,539,507 | A | 9/1985 | VanSlyke et al. |
| 4,885,211 | A | 12/1989 | Tang et al. |
| 6,388,377 | B1 | 5/2002 | Kobayashi et al. |
| 2003/0011304 | A1* | 1/2003 | Duineveld et al. .......... 313/506 |
| 2003/0107560 | A1* | 6/2003 | Yumoto et al. ............. 345/204 |
| 2004/0051457 | A1* | 3/2004 | Kimura et al. ............. 313/586 |
| 2004/0140759 | A1* | 7/2004 | Park et al. .................. 313/504 |
| 2005/0067957 | A1* | 3/2005 | Moon ........................ 313/582 |

FOREIGN PATENT DOCUMENTS

| EP | 0 989 778 | 3/2000 |
| EP | 0 996 314 | 4/2000 |
| JP | 09-203803 | 8/1997 |
| JP | 09-230129 | 9/1997 |
| KR | 10-2004-0055365 | 6/2004 |
| WO | 00/76008 | 12/2000 |
| WO | 03/065474 | 8/2003 |

* cited by examiner

*Primary Examiner*—Joseph Williams
*Assistant Examiner*—Bumsuk Won
(74) *Attorney, Agent, or Firm*—H.C. Park & Associates, PLC

(57) ABSTRACT

A flat display device and a method of manufacturing the same are disclosed. The flat panel display includes first electrode layers and second electrode layers arranged on top of a substrate. Multiple pixel regions, arranged between the first electrode layer and the second electrode layer, are formed by a light-emitting portion which includes light-emitting layers. Barriers are formed with at least one or more layers at least partially between the pixel regions, and a groove portion is formed at least partially on one side of each barrier.

18 Claims, 10 Drawing Sheets

FLAT DISPLAY DEVICE INCLUDING AN OVERFLOW BARRIER

CROSS REFERENCE TO RELATED APPLCATIONS

This application claims priority to German Patent Application No. 103 51 195.4, filed on Oct. 30, 2003, in the German Intellectual Property Office, and priority to Korean Patent Application No. 2004-10605, filed on Feb. 18, 2004, in the Korean Intellectual Property Office, the disclosures of which are incorporated herein by reference in their entireties.

BACKGROUND OF THE INVENTION

1. Field of the Invention

The present invention relates to flat display devices generally, and more particularly, to a flat display device that includes barriers to prevent ink from overflowing to neighboring pixel regions during an inkjet print process, and a method of manufacturing the same.

2. Description of the Related Art

An inkjet printing process is a significant structuring process for the production of a full-color image formed by a semi-conducting light-emitting polymer (LEP). In this case, small drops of a solution that include the corresponding polymer are deposited onto a suitable substrate. This process may also be used in other technical areas such as the deposition of color filters or DNA sensors onto a substrate.

All of these applications demand an exact placement of the substances (ink) deposited onto a predetermined active surface. The inkjet printing technique has this property. In inkjet printing, ink is produced by dissolving an active substance in an auxiliary substance. Then, this ink is deposited in small quantities in drop form onto the substrate, e.g., by means of a piezo or "bubble jet" inkjet technique. The exact positioning of the drop on the substrate is accomplished mechanically positioning the inkjet head over the substrate. After evaporation of the auxiliary substance, the active substance forms a film on the active surface of the substrate.

A frequent problem during the printing process is the dispersion of a drop of ink from the active substance into neighbouring surfaces of the substrate. This results in a mixing of colors in display elements including organic light-emitting diodes (OLED) because red, green or blue emitting areas are arranged in the immediate vicinity of one another.

Developed in the late eighties of the last century. OLED displays can be categorized into polymer OLEDs (PLED) and low-molecular OLEDs (SM-OLED). For example, PCT Patent No. WO 00/76008A1 (CDT) discloses the structure of a PLED display element. Additionally, Patent Nos. U.S. Pat. No. 4,539,507 and U.S. Pat. No. 4,885,211 (Eastman-Kodak) disclose the principle structure of an SM-OLED in which $ALQ_3$ (tris-(5-chloro-8-hydroxy-quinolinato)-aluminium) is used as a light-emitting and electron transporting material.

The fundamental principle upon which OLEDs are based is electro luminescence, whereby electrons and holes are injected into a semi-conducting material via suitable contacts, and light is generated by the recombination of these charge carriers.

A piezo inkjet printing technique is one of the most significant structuring technologies for the production of full-colur displays based on polymer OLEDs. Small drops of a solution containing the active substance (hole transporting or light-emitting material) are deposited on the active surface of a suitable substrate. The dimension of the active surface (single pixel) for a high-resolution display element, as used, for example, in modern mobile telephones, is in the range of 40 µm×180 µm.

Conventional inkjet heads can produce ink drops with a diameter of 30 µm. The ink drop has a diameter of the same magnitude as a pixel to be coated. In order to prevent the drop from overflowing, the surface of the substrate is formed by suitable means.

In this regard, two strategies are pursued:

A substrate surface can be produced in such a way that different areas have different surface energies and therefore allow the ink to move in different ways. Also, geometrical (mechanical) barriers designed to prevent an overflow of the drop may be used.

An application of the first strategy is described in European Patent No. 0989778 A1 (Seiko-Epson). A non-constant surface energy is created by a suitable selection of materials which form the substrate surface. The ink can only spread in areas with high surface energy whereas areas with low surface energy act as barriers. In order to obtain a homogenous thickness of the film, it is also an advantage to form a high surface energy region beyond the periphery of the pixel surface of the OLED. The film is then homogenous in the peripheral zone and the layer thickness noticeably reduces just outside of the active zone near the barrier. The required differences between the surface energies can be achieved in many different ways. European Patent No. 0989778 A1 (Seiko Epson) discloses a substrate surface having a two-layer structure. By means of a suitable surface treatment using plasma, the upper layer of the substrate can be provided with low surface energy while the lower layer, based on its chemical nature, can be provided with high surface energy using the same treatment. Conventionally, the lower layer is composed of inorganic materials such as silicon oxide/nitride.

In this example, the inorganic layer acts as a peripheral zone with high surface energy and facilitates the depositing of homogenous polymer films using the inkjet printing process.

The depositing and structuring of this layer, however, requires processes used typically in the semi-conductor industry. For the layer deposition, sputter processes and gas phase processes such as PECVD (Plasma Enhanced Chemical Vapour Deposition) can be used. These processes require long pulse times and, in addition, are cost-intensive, thus reducing the cost-advantage gained with the OLED-technology. In addition, the second layer provides a surface topography, that is, the areas with low surface energy (called "separators" here) have a finite height above the main substrate surface. As a result of this height profile, the separated polymer film can form an undesirable thickness profile when curving upwards into the peripheral areas at the separators. Depending on the dimensions, the upward curving can protrude into the pixels.

A further disadvantage, discussed in EP 0989778, is that an ink reservoir is used as further overflow protection. This reservoir must have at least a minimum volume in order to accommodate a sufficient partial quantity of an (ink-) drop. A necessary depth of several 100 nm produces an edge upon which the subsequently deposited cathode layer can break. This can lead to an increased power input or a failure of an indicating element. The structuring of this reservoir is time-consuming and increases the technological difficulty due to the incorporation of a further process step.

Japanese laid-open patent No. 09203803 discloses a chemical treatment of a substrate surface that had been treated with a photo-resist beforehand. Following this, the photo-resist is exposed while using a mask, and developed. In the resulting structure, the areas where the photo-resist remains have low surface energy while areas where the photo-resist are removed have high surface energy. Flanks of the photo-resist structure have a mean surface energy and, thus, there is a fairly smooth transition of the surface energies. However, the flanks do not form a boundary with a freely selectable surface energy and geometry. This is a disadvantage because the spatial dissolution capacity of the inkjet printing process declines in areas with the mean surface energy. A further disadvantage is the fact that only one photo-resist composed of a single material can be used. Therefore, a contrast of the surface energies cannot be produced by the application of various materials, and this restricts the applicability of the OLED. In addition, the chemical treatment required is time-consuming resulting in a long manufacturing time.

Japanese Laid-open Patent No. 09230129 discloses a two-stage treatment of a surface. First, the entire surface is provided with low surface energy. As a result of a subsequent treatment of selected regions of the surface with short-wave length light, the surface energy is these areas is increased. The contrast in the surface energy is, however, limited, and the required exposure time is too long a mass production.

Geometrical (mechanical) barriers are described as a second possibility for preventing an overflow of a drop of ink.

U.S. Pat. No. 6,388,377 B1 discloses photo-resist stripe structures which are positioned between neighbouring pixels. These photo-resist stripes have a height of at least 2 µm and form a physical barrier preventing an overflow of an ink drop. The production of such a photo-resist structure is disclosed in European Patent No. 0996314 A1. Two photo-resist structures in each case, arranged parallel to one another form banks of a channel, in the centre of which there are pixels which later emit the same colour (red, green or blue). The printing of a suitable ink in the channel provides the pixels with active material and the photo-resist structure prevents an overflow of ink to pixels adjacent to the channel. The height of the banks is larger than 0.5×(width of the pixel/diameter of the drop). The height is also greater than the thickness of the active material deposited by means of the inkjet printing technique. Banks with a fine structure are obtained by applying round, oval or triangular notch indentations to the banks thus forming an overflow reservoir. However, the height of the banks and/or the edges reduces the quality of metal deposition in a subsequent step. In the metal deposition, the cathode of the OLED structural element is formed by thermal evaporation or sputtering. Based on the form and height of the photo-resist structures an interruption occurs, or at least a thinner deposition of the metal film on the side walls of the banks is obtained. This leads to increased electrical resistance which has a disadvantageous effect on the power input of the display element.

SUMMARY OF THE INVENTION

The present invention provides a thin flat panel OLED in which an overflow of an ink drop into a neighboring reservoir may be effectively prevented, and a method of manufacturing the same.

The present invention also provides a flat display device in which an OLED is composed of only organic materials, and a method of manufacturing the same. The present invention also provides a flat display device with prespecified quality requirements that is inexpensive to produce.

To prevent ink overflow, one or more embodiments of the present invention provide a barrier having a small height, which prevents or considerably reduces a deposition on the middle of the electrode layer or the side walls of the barriers. The thinner deposition increases power input to the flat display device and results in a more effective operation. In other words, because cathode film deposition does not occur during a subsequent depositing of a cathode layer on the barrier (both on its outer edges as well as on edges resulting from a possibly applied overflow reservoir), and the cathode film has a significantly lower electrical resistance, power required to operate the flat display device can be reduced.

In this respect, at least one barrier has a groove along its longitudinal axis on its upper side. The barriers, or separators, can be formed of a photo-resist. Barriers formed from photo-resist with a height less than 1 µm and a groove with a depth less than 0.1 µm provide effective overflow protection for ink drops used in the inkjet printing process (ink drops with a diameter normally larger than 20 µm). The barriers in conventional display devices without grooves require a height of at least 4 µm in order to prevent an overflow in a similarly effective manner. The effective overflow prevention in embodiment of the invention is primarily attributed to a physical interaction between the ink drop and the edges created by the groove formed in the barrier. For this reason, the substrate according to embodiments of the present invention can be applied OLED-displays because overflow of the ink into neighboring ink reservoirs (pixels) can be effectively prevented. Also the small height profile reduces the power required for the OLED-display because an interruption or at least a thinner deposition on the side walls of the deposition of the (cathode-) metal film on the side walls of the barriers (separators) can be avoided or considerably reduced.

An indium-tin oxide layer or a layer composed of another material suitable for hole injection is formed on the base substrate. The indium-tin-oxide layer may have a striped pattern. The barriers formed from the photo-resist can completely cover the spaces between and the borders of the indium-tin-oxide layer.

The barriers can be arranged such that neighbouring indium-tin-oxide strips are symmetric about each barrier. The groove can be formed in the center of the barrier. The base substrate can be composed of glass, synthetic material or silicon.

Because of the barriers, having grooves ink to be applied later (by means of an inkjet printing process) does not overflow to other regions. In this case, the ink in the inkjet printing process to be applied to the substrate consists of a solution which contains the substances to be deposited, for example, a polymer for a display on the basis of organic light-emitting diodes. The substrate according to embodiments of the present invention, however, is not limited to applications including the inkjet printing process for displays on the basis of organic light-emitting diodes. The ink can include color filters or DNA sensors.

Surfaces of the substrate not covered by the barriers, can form the active surfaces (pixels) of the substrate. Grooves can be formed in all of the barriers.

The method of manufacturing a display device according to embodiments of the present invention includes forming a groove in the upper side of at least one barrier along its longitudinal axis. The groove is produced by means of plasma etching. An etchant used for the plasma etching can include $CF_4$ and $O_2$ in a ration of 1:4.

Regions of the barriers in which no grooves are formed are covered before the plasma etching process with a further (protective) photo-resist layer. When the barriers are formed from a photo-resist, the protective photo-resist layer is formed on the areas of the barriers not to be etched, and protects the barriers and is subsequently removed. The protective photo-resist layer can be formed by depositing, exposure and development. The photo-resist layer structure can be removed by means of acetone. An indium-tin-oxide layer is deposited onto the substrate before forming the longitudinal barriers, which are arranged in parallel, and the indium-tin-oxide layer serves as an anode layer of the OLED display.

In one embodiment, a flat display device includes a substrate, a first electrode on the substrate, a second electrode above the first electrode, a plurality of pixel regions comprising light emitting layers interposed between the first electrode and the second electrode, and barriers formed on at least a portion between the pixel regions and with at least one layer, each of the barriers having a groove formed on at least one side thereof.

According to another aspect of the present invention, the groove portions have a striped or mesh pattern.

Thus, neighboring pixel regions may be separated by the barriers with the groove portions and include different light-emitting layers.

Alternatively, at least one of the pixel regions is surrounded by identical mesh groove portions and includes light-emitting layers emitting identical colors.

Additionally, the barrier may be formed from a photo-resist.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
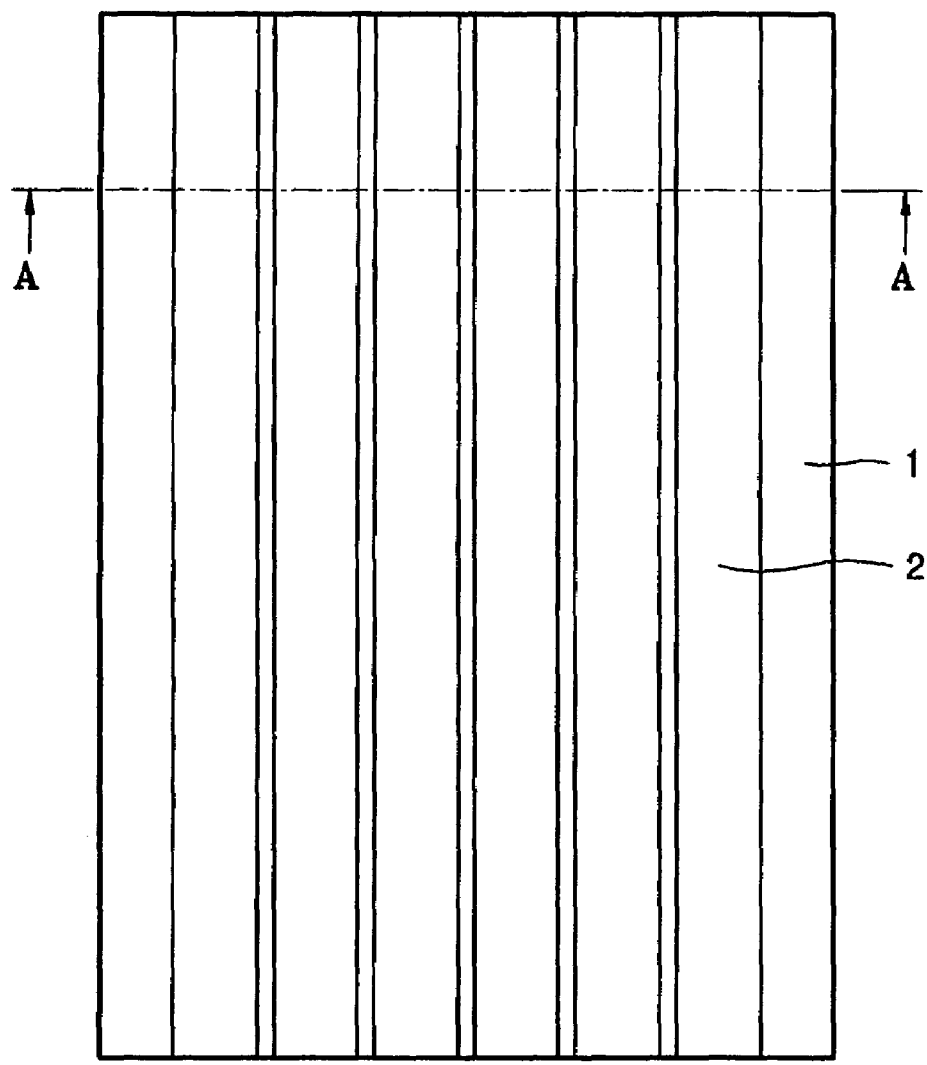
FIGS. 1, 2, 3, 4, 5, 6, 7, 8 and 9 are schematic diagrams illustrating a process of manufacturing a passive matrix driving flat display device according to an embodiment of the present invention.

FIGS. 1, 2, 3, 4, 5, 6, 7, 8, and 9 illustrate a passive matrix (PM) display device according to an embodiment of the present invention. FIG. 1 is a plan view of a substrate 1 having arranged thereon first electrode layers 2 which are anodes, however, the invention is not limited to this. In addition, the first electrode layer 2, an anode, may be composed of various materials, but is a transparent electrode composed of an indium-tin-oxide in the present embodiment. The first electrode layer 2 forms pixel regions, which emit light, with a light-emitting portion (including a light-emitting layer) and a second electrode layer which is arranged on top of the first electrode layer 2.

As shown in FIG. 1 the substrate is composed of a boro silicate glass with a thickness of approximately 1.1 mm. However, the present invention is not limited to this and the substrate may be composed of, for example, one or more of glass, a synthetic material, and silicon.

Figure 2:
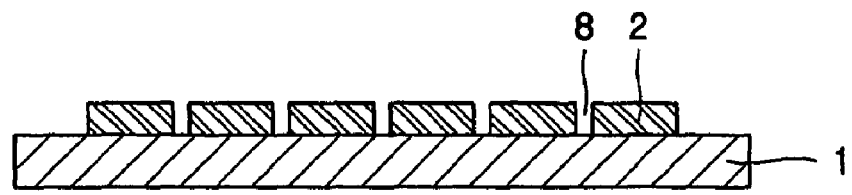

The first electrode layers 2 is formed on the substrate as individual strip with a thickness of approximately 100 nm 1. As shown in FIG. 1 and FIG. 2, the respective strips of the first electrode layer 2 are formed using a conventional method such as etching to a width of 70 µm, with a distance 8 µm of 100 µm between the strips.

Figure 3:
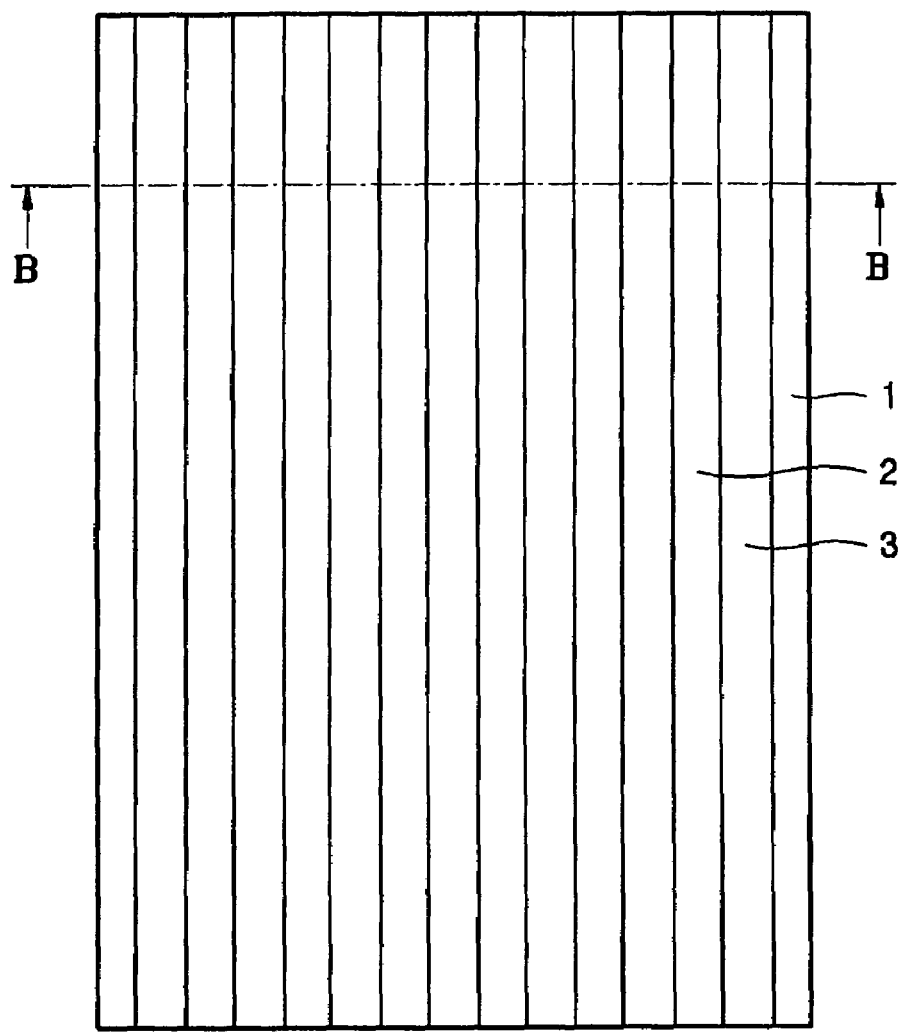
Figure 4:
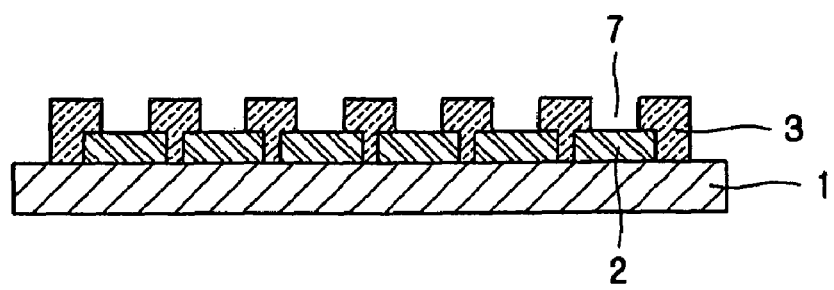

Next, referring to FIGS. 3 and 4, barriers 3 are formed between pixel regions formed by the first electrode layer 2 and are disposed on the substrate 1. That is, the barriers 3 are formed parallel to and between the first electrode layers 2. A photo-resist, for example, on a Novolak basis or a JEM 750 photo-resist of Messrs JSR (Japan Synthetic Rubber) may be used as barriers. Alternative photo resists may include an acrylic laquer, an epoxy laquer, and a polyamide laquer. When using a photo-resist as the barriers 3, the photo-resist is spin-coated to a thickness of 500 mm. The coated photo-resist is then exposed and developed using an appropriate photo-mask, and may be thermally treated at a temperature of 200° C. for approximately one hour.

As shown barriers 3 partially overlap the first electrode layer 2, have the same length as the first electrode layer 2, and have a width of approximately 25 mm and a height of approximately 0.35 mm. The barriers 3 may be formed in the exact middle of neighboring first electrode layers 2. The channel surrounded by the barriers 3 forms a pixel region, which acts as an ink reservoir 7 in which ink is coated in a post inkjet printing process. The light-emitting portion is formed on top of the following first electrode layer 2, and adjacent light-emitting portion forming pixel regions include light-emitting layers which emit different colors.

Figure 5:
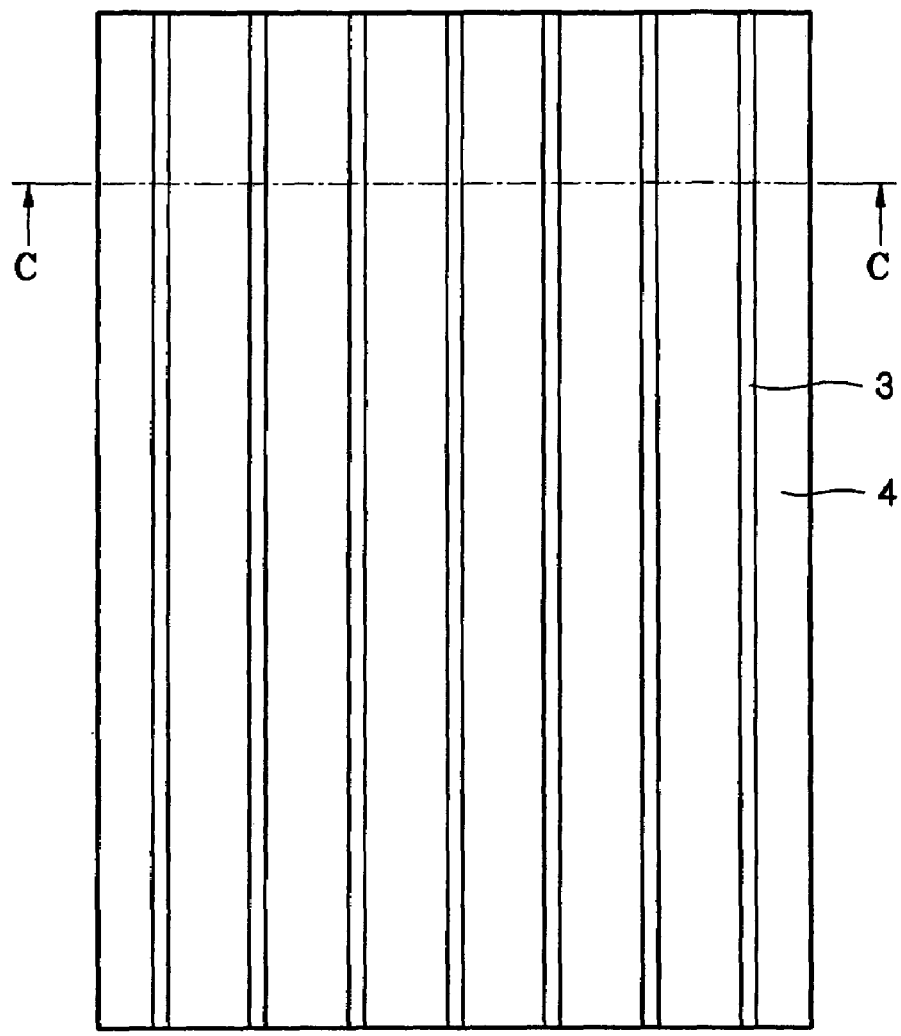
Figure 6:
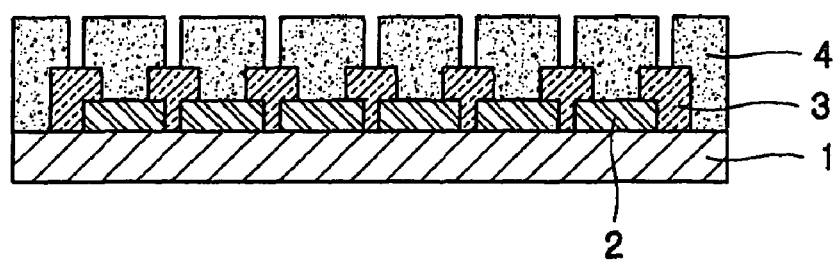

Referring to FIGS. 5 and 6, after the barriers 3 are formed, a photo-resist layer 4 (illustratively, AL 6612 of Messrs Clariant) is deposited using conventional technology and covers the entire surface except for portions centered between adjacent barriers 3 with a width of 7 µm. As shown in FIGS. 5 and 6, the thickness of the photo-resist layer structure 4 can be 1 µm.

Figure 7:
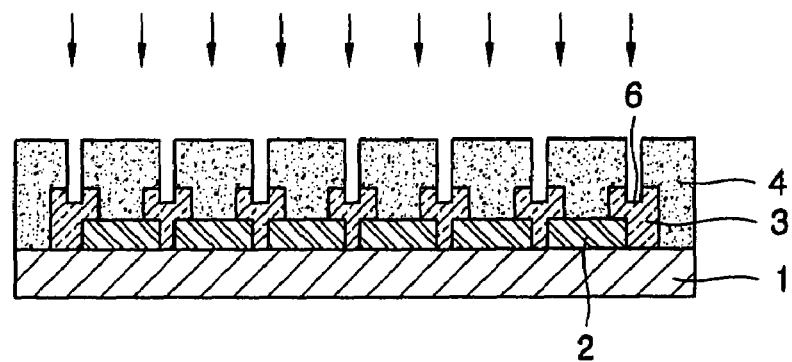

Referring to FIG. 7, a portion of the barriers 3 not covered by the photo-resist structure 4 is etched for 10 minutes using plasma containing $CF_4/O_2$ with a ratio of 1:4 and with an energy of 300 W. Thus, a groove portion 6 with a depth of 30 nm is formed in each of the barriers 3. The groove portions 6 are formed in regions of the barrier 3 not covered by the photo-resist layer structure 4. Preferably, the groove portions 6 are formed in the middle of the top surfaces of the barriers 3.

Figure 8:
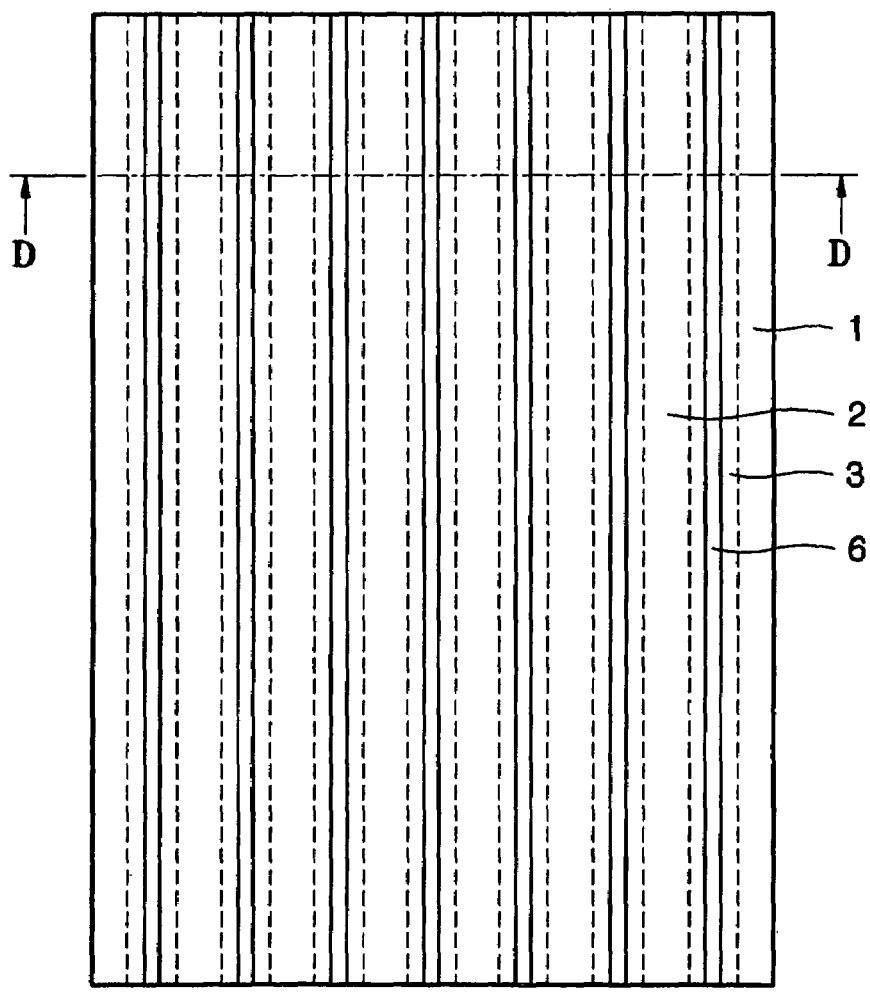
Figure 9:
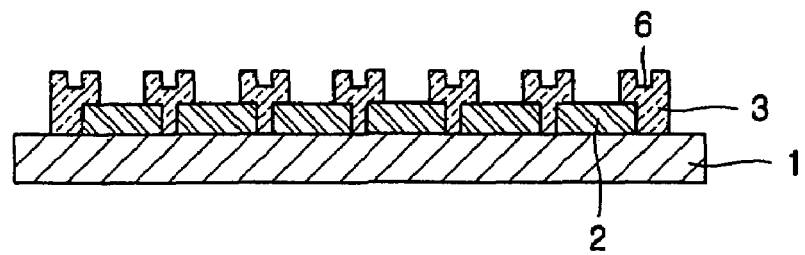

Referring to FIGS. 8 and 9, after the groove portions 6 are formed, the photo-resist layer structure 4 is removed. Illustratively, photo-resist layer structure 4 may be removed in less than one minute by means of acetone in an ultrasonic bath.

Referring back to FIG. 1, the base substrate 1 may include an indium-tin-oxide layer structure 2. In one embodiment, the indium-tin-oxide layer structure 2 is composed of individual indium-tin-oxide stripes which have a thickness of 100 nm. The base substrate 1 may consist of Bohr silicate glass with a thickness of 1.1 μm. In order to maintain the indium-tin-oxide layer structure 2, a continuous indium-tin-oxide layer is structured in such a way that parallel arranged stripes with a width of 70 μm and interim spaces 8 with a width of 10 μm occur, as shown in FIG. 2.

In a next process step for the production of the substrate, a large number of longitudinal barriers 3, arranged essentially in parallel, are deposited onto the base substrate 2, as shown schematically in FIGS. 3 and 4. The barriers 3 may consist of a photo-resist on a Novolak basis, JEM750 of Messrs JSR (Japan Synthetic Rubber). In order to produce the barriers 3, the photo-resist is applied with a thickness of 500 nm by means of spin coating and exposed with a suitable photo mask. After developing, the photo-resist is subjected to thermal post-treatment at 200° C. for one hour. The structuring of the photo-resist layer is effected in such a way that cuboid-shaped barriers 3 are formed with a height of 0.35 μm and a width of 25 μm and a length which corresponds to the length of the ITO stripes in the area of the substrate containing the pixels. These barriers 3 are positioned exactly in the middle between each of two neighboring ITO stripes 2. The channels enclosed by the barriers 3 form the ink reservoirs 7 into which the ink is applied in the inkjet printing process later.

In a further process step for the production of the substrate according to the invention, a photo-resist layer structure 4 (AZ 6612 of Messrs Clariant) is deposited by means of standard technologies and structured in such a way that the entire substrate is covered, with the exception of those particular surfaces which are located symmetrically along the longitudinal axis of the barriers with 7 μm width. The thickness of the photo-resist layer structure 4 is 1 μm, as shown schematically in FIGS. 5 and 6.

In a next process step (FIG. 7) those particular surfaces which are not covered by the photo-resist layer structure 4 are etched for 10 minutes by means of plasma etching with the use of a 1:4 $CF_4/O_2$ gas mixture at 300 W plasma power. In this way, a groove 6 and/or a recess with a depth of 30 nm is produced on the upper side of the barriers 3, as shown in FIG. 7. Based on the protective photo-resist layer structure 4, the groove 6 is produced only in that area of the barriers 3 which is not covered by the photo-resist layer structure 4. In a further process step (FIGS. 8 and 9), the photo-resist layer structure 4 is removed thoroughly from the substrate within one minute by means of acetone in an ultrasonic bath. After the substrate according to the invention has been produced in specified form, (by means of coating of the base substrate 1 with an ITO structure 2, application of barriers 3 and a photo-resist layer structure 4, where only a middle stripe of the barriers 3 is not covered by the photo-resist layer structure 4, plasma etching treatment and subsequent removal of the photo-resist layer structure 4), the active surface can be coated with either a hole-conducting and/or a light-emitting layer using an inkjet printing technique.

As shown in FIG. 9, the groove portion 6, according to an embodiment of the present invention, is formed in strips and preferably the pixel region which is placed within the same channel formed by identical barriers 3, which include the groove portion 6, may include a single color light-emitting layer.

Figure 10:
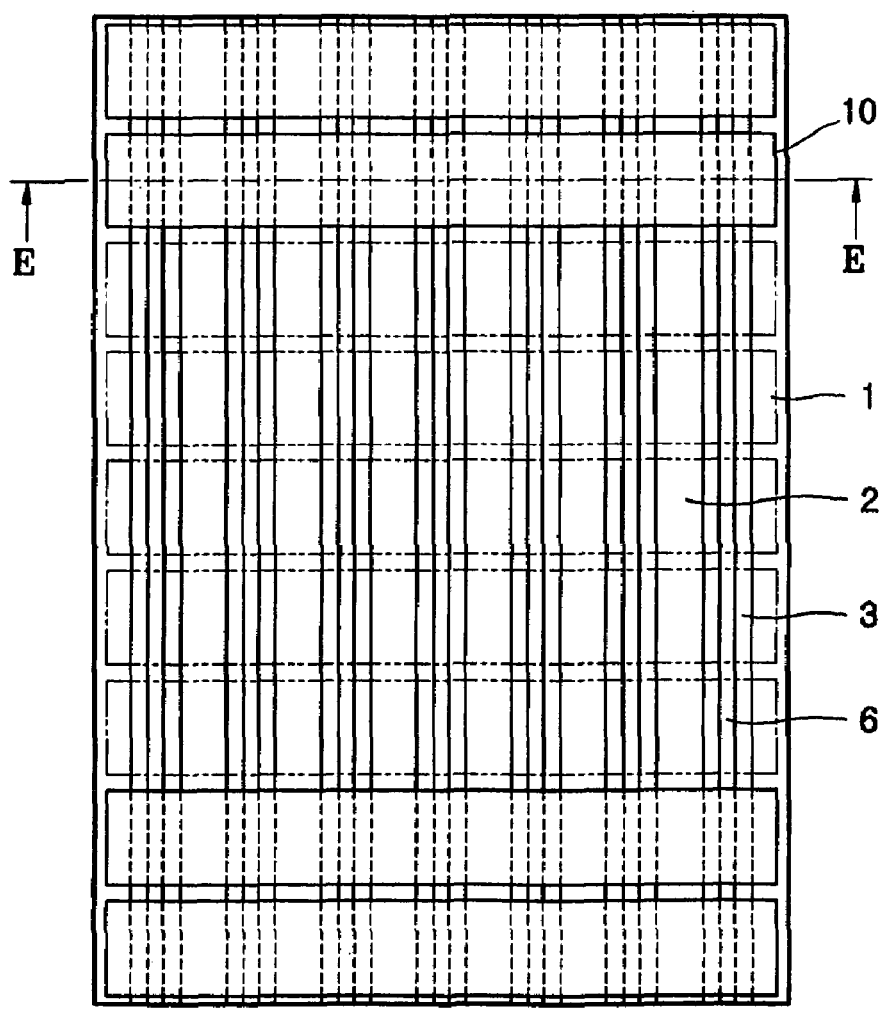
FIG. 10 is a plan view of the passive matrix driving flat display device manufactured according to FIGS. 1 through 9.
Figure 11:
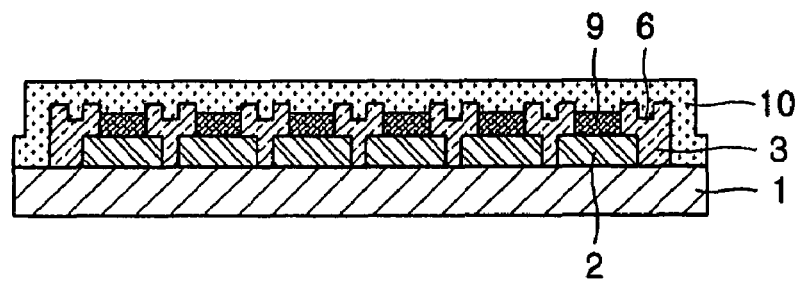
FIG. 11 is a cross-sectional view of the flat display device, according to the line of E-E of FIG. 10.

Referring to FIGS. 10 and 11, after the groove portion 6 is formed, a light-emitting portion 9 including an light-emitting layer is formed in the ink reservoir 7 of a pixel region, and a second electrode layer 10 may be formed on top. As shown in FIG. 10 the second electrode layer 10, which is a cathode layer, may include a plurality of strips. A pixel region may be formed where the first electrode layer 1 and the second electrode layer 10 intersect. The light-emitting layer, may be bounded by one or more barriers 3.

Figure 12:
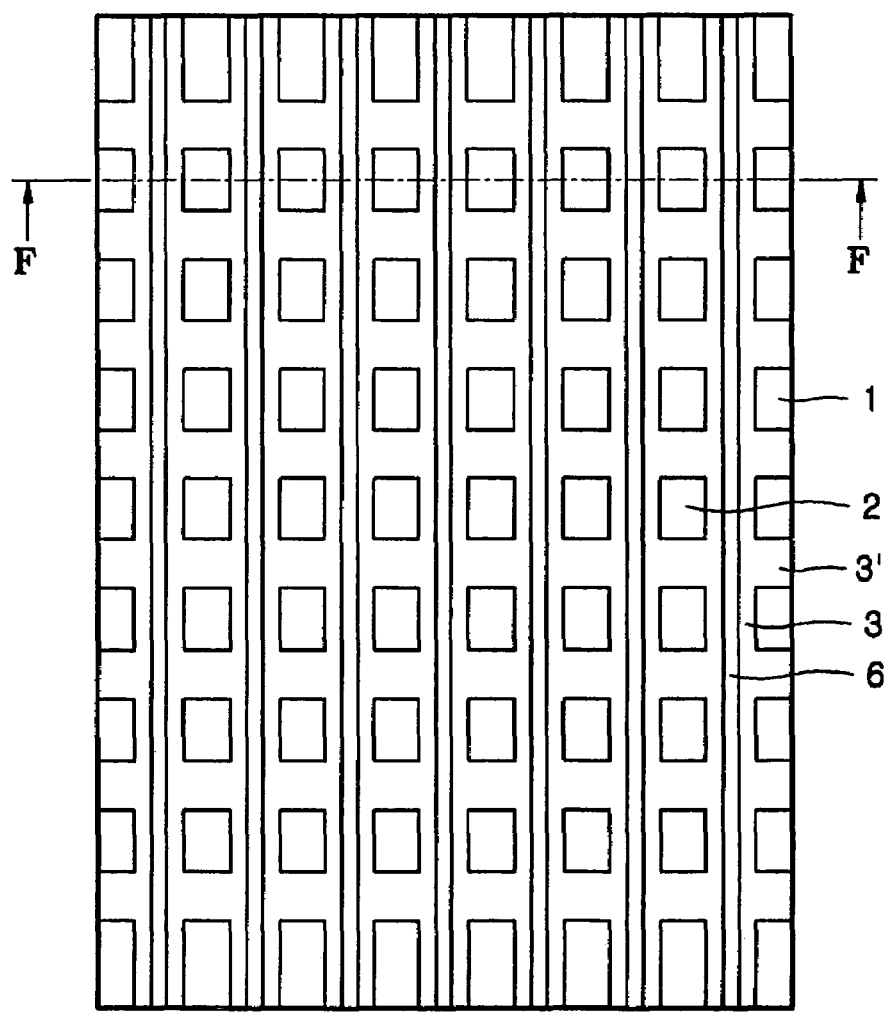
FIG. 12 is a plan view of an active matrix (AM) driving flat display device, according to another embodiment of the present invention.
Figure 13:
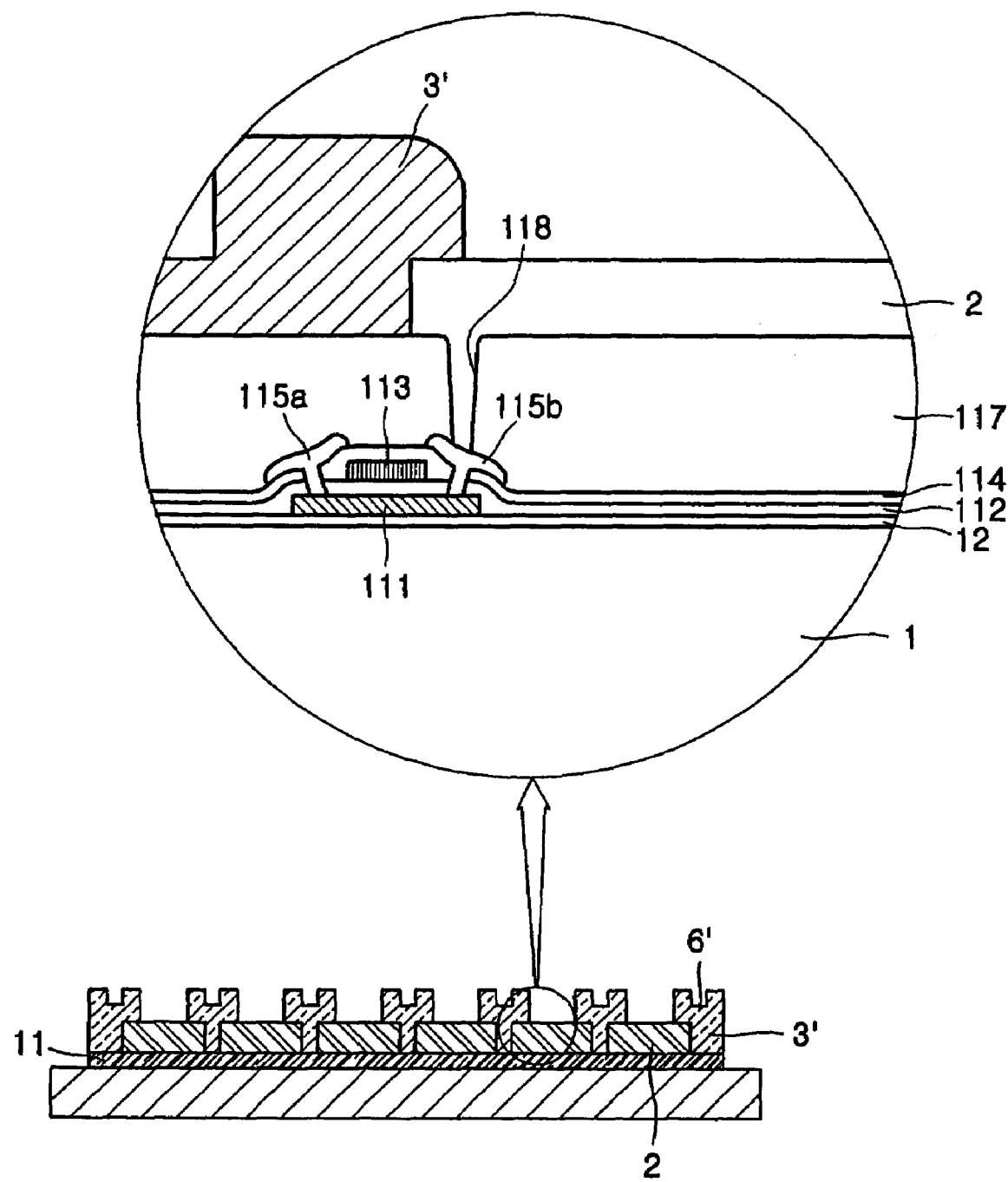
FIG. 13 is a cross-sectional view of a flat display device, along the line of F-F of FIG. 12.

FIGS. 12 and 13 illustrate an active matrix electroluminescent device according to another embodiment of the present invention. FIG. 13 illustrates a cross sectional view along a line F-F' of FIG. 12. As shown, a driving layer 11 may be further included between the substrate 1 and the first electrode layer 2. A magnified view of the driving layer 11 is shown in FIG. 13. A buffer layer 12 is formed on the substrate 1, a semiconductor active layer 111 and a gate electrode 113 are formed on the buffer layer 12, a gate insulating layer 112 electrically insulates the semiconductor active layer 111 and the gate electrode 113, and the semiconductor active layer 111 is activated by an electrical signal. An intermediate layer 114 composed of $SiO_2$ or $SiNx$ is formed on the gate electrode 113, and source and drain electrodes 115a and 115b are formed on the middle layer. A passivation layer and/or a planarization layer 117 is formed on the source and drain electrode 115a and 115b. The first electrode layer 2 is electrically connected to the drain electrode 115b by a via hole 118 formed in the passivation layer and/or planarization layer 117. In the drawings the driving layer 11 includes a thin-film-transistor (TFT) with a top-gate structure, however, this is just an example and the invention is not limited to this.

After a first electrode layer 2 forms pixel regions with an electric light-emitting portion and the second electrode, which are formed afterwards, barriers 3' are formed between the pixel regions. The barriers 3' define pixels and are formed in a mesh form between respective pixel regions.

After the barriers 3' are formed, in a manner identical to that of the previous embodiment, a photo-resist is formed (refer to FIGS. 5 and 6). Then, a groove portion is formed in the barrier 3' using plasma etching (refer to FIG. 7). The plasma etching is carried out for approximately 10 minutes using a 1:4 CF4/O2 etchant at a power of approximately 300 W. After forming the groove portion in a specific shape beforehand, the photo-resist is removed using acetone in an ultrasonic bath for less than one minute. The etching and removing of the photo-resist is only an example and the present invention is not limited to this example.

After the groove portion is formed, an electric light-emitting portion including an light-emitting layer is formed in the pixel region of an ink reservoir, and the electric light-emitting portion further comprises an electron transport layer (hole transportation layer and/or electron transportation layer) between the first electrode layer and the light-emitting layer and/or between the light-emitting layer and the second electrode layer.

Figure 14:
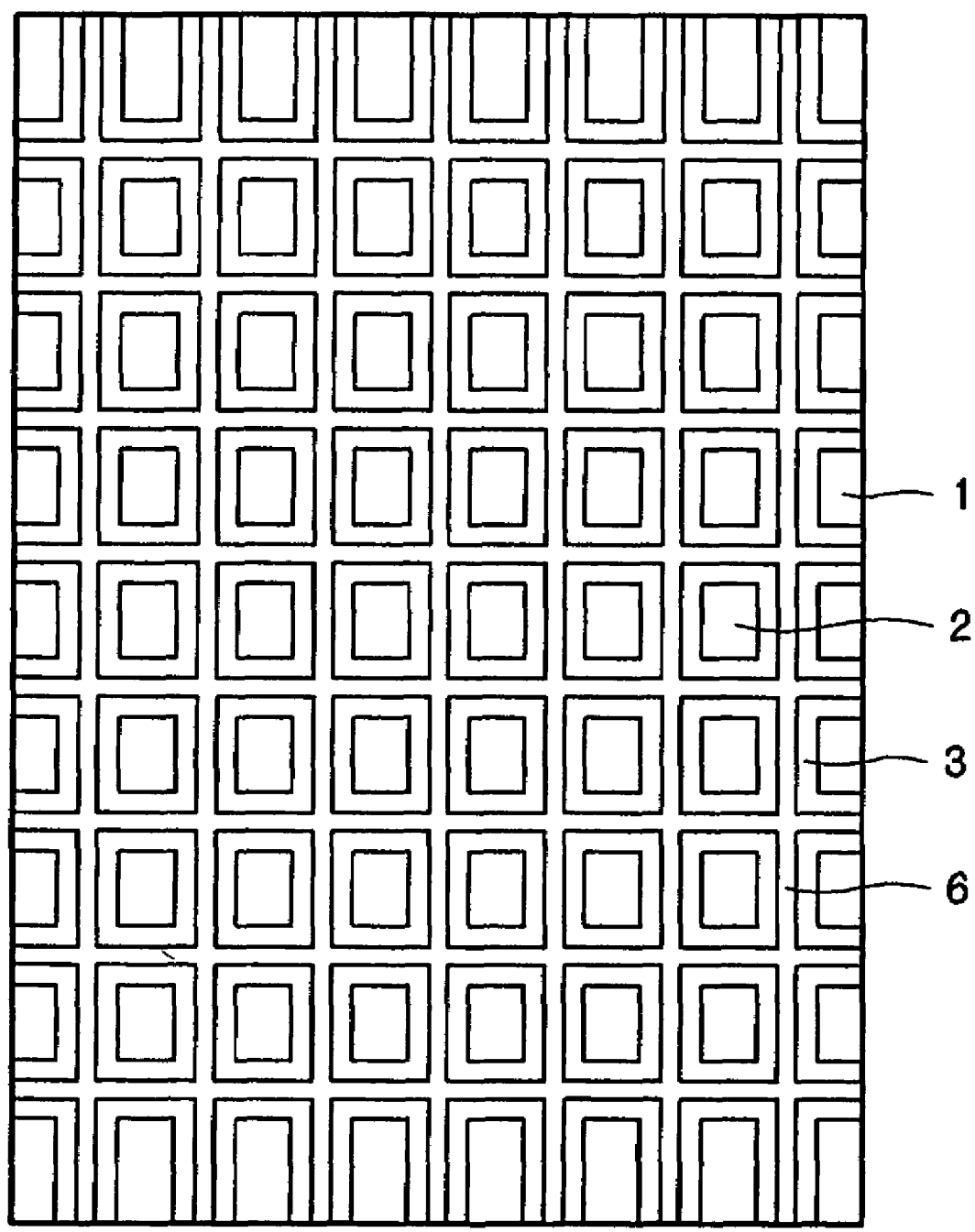
FIGS. 14 and 15 are plan views of a active matrix driving flat display device, according to another embodiment of the present invention.
Figure 15:
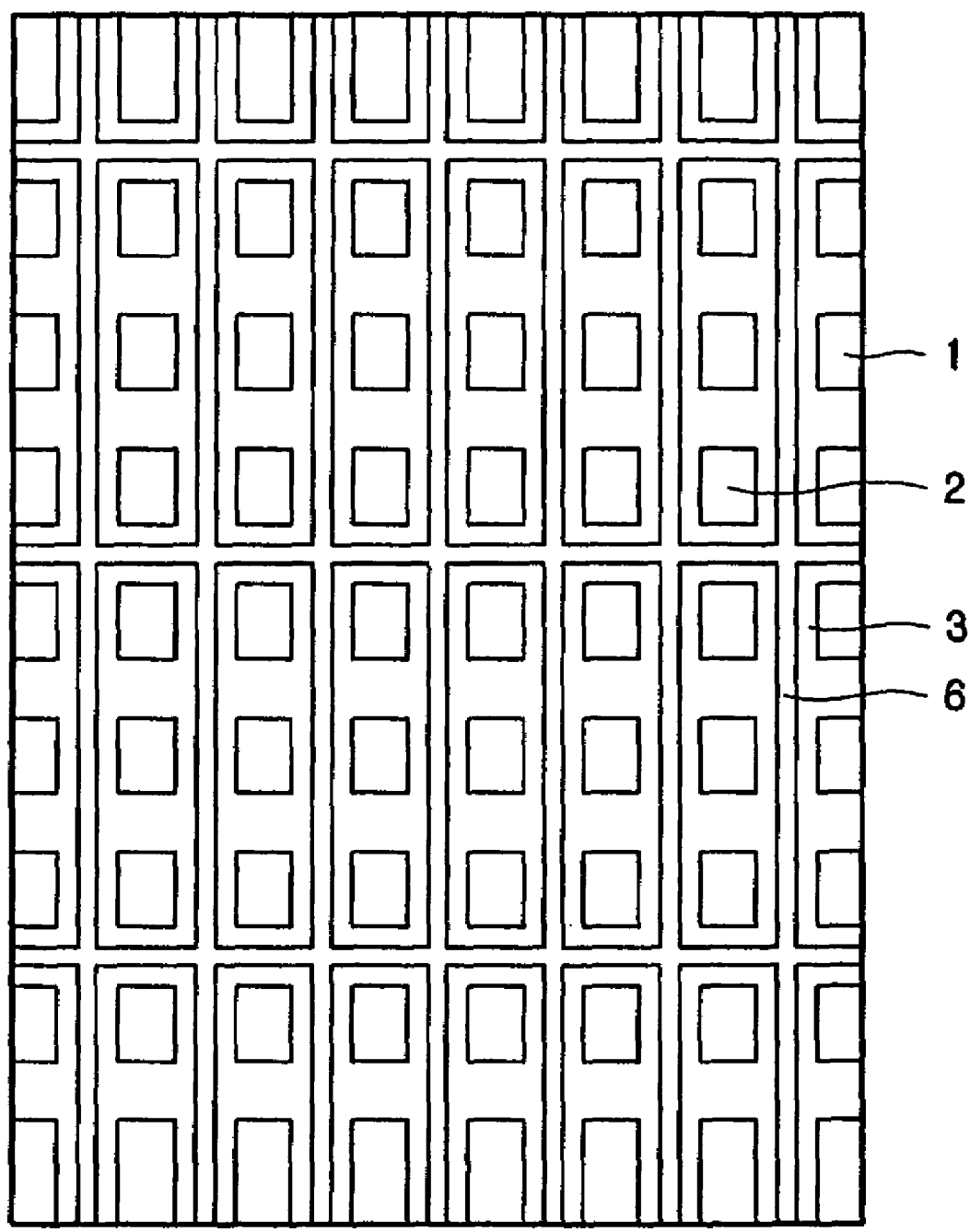

In FIG. 12, a groove portion 6' has a striped pattern, and pixel regions arranged between adjacent groove portions include light-emitting layers which emit identical colors. The groove portion may have various patterns besides the striped pattern shown in FIG. 12. For example, the groove portion may have a mesh pattern as shown in FIG. 14. Referring to FIG. 14, groove portions 6' are formed in all regions of the barriers 3', which are arranged between pixel regions, and surround all pixel regions. Referring to FIG. 15, the groove portion can be defined to enclose more than two pixel regions. When the groove portion 6 formed in the barriers 3' have a mesh pattern, the pixel region in the identical mesh includes light-emitting layers, which emit identical colors.

Meanwhile, as mentioned with reference to FIG. 9, the barriers 3' may have a height less than 1 μm and a groove portion 6' may have a width less than approximately 0.1 μm. In addition, the barriers 3' can be formed such that neighboring pixel regions are symmetrical about the barriers 3' and the groove portions 6' can be formed in the middle of the top surfaces of the barriers 3'.

According to another embodiment of the present invention, a barrier 3'a and 3'b may be realized as a double layer. That is, referring to FIGS. 16 and 17, after the first electrode layer 2 is formed on top of the substrate 1, the first barrier 3'a is formed between pixel regions formed by the first electrode layer 2, and a second barrier 3'b may be formed on top of the first barrier 3'a. The first and second barriers 3'a and 3'b can be arranged such that adjacent pixel regions are symmetrical about the barrier 3'a and 3'b.

Figure 16:
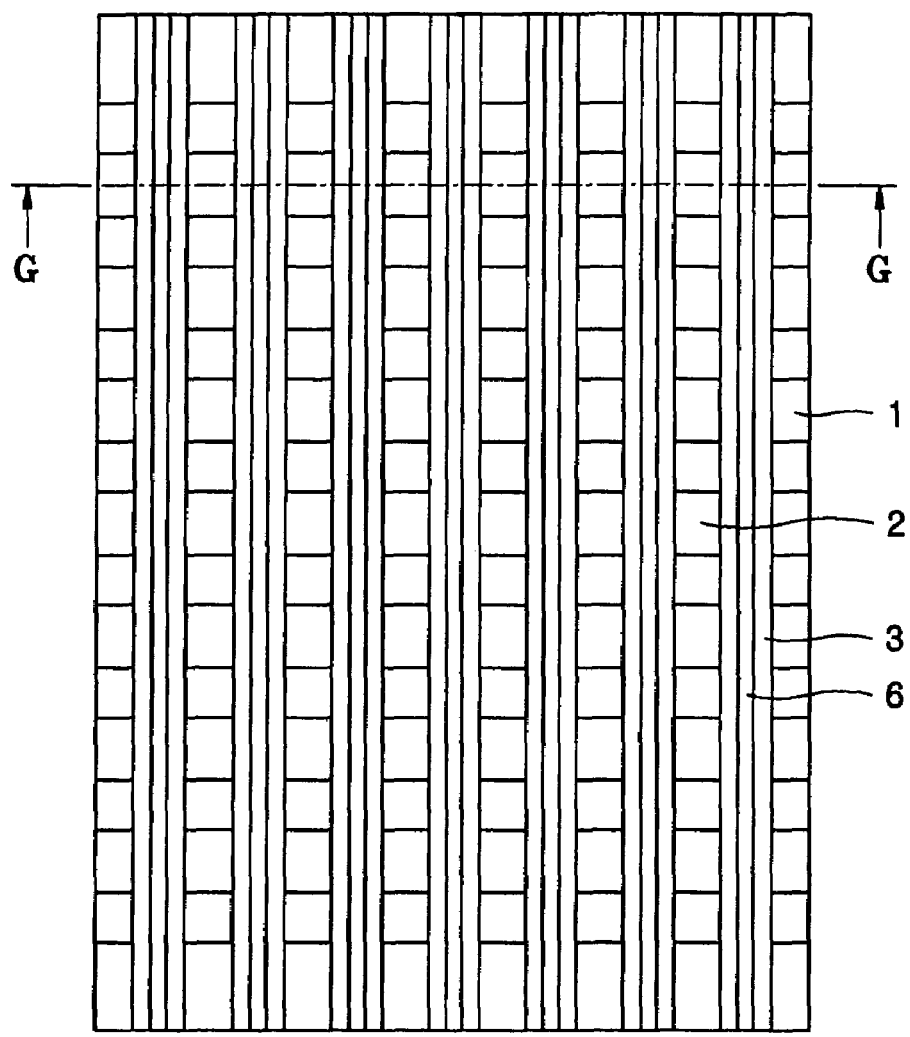
FIG. 16 is a plan view of the active matrix (AM) driving flat display device.
Figure 17:
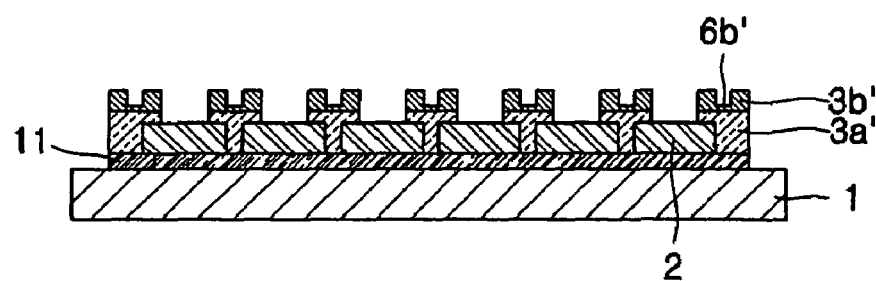
FIG. 17 is a cross-sectional view along the line G-G of FIG. 16.

When the light-emitting portion is formed in the pixel region, which is an ink reservoir, the groove portion 6'b is formed in the second barrier 3'b and may be formed in the middle of the second barrier 3'b. Meanwhile, the first barriers 3a' are formed in a mesh pattern surrounding pixel regions, while the second barrier 3'b can have a striped pattern as illustrated in FIG. 16 or can have various patterns such as a mesh pattern. In addition, the groove portion 6'b formed in the second barrier 3'b may have a striped pattern or mesh pattern. As in the above-described embodiments, when the groove portion 6'b has a striped pattern, the pixel regions disposed between adjacent groove portions can include light-emitting layers emitting identical colors. Furthermore, when the groove portion is formed in mesh form, the pixel region in the identical mesh includes light-emitting layers which emit identical colors.

As described with reference to FIG. 9, the total height of the barrier 3'a and 3'b is less than approximately 1 μm, and the groove portion 6'b has a width less than approximately 0.1 μm.

The present invention can be applied not only to display devices but also to various technological areas. For example, the ink can be replaced with a DNA sensor or a color filter and the solvent can include deposited material such as a polymer used in an organic electric field emitting display device.

The display device according to the embodiments of the present invention is thin despite having sufficient overflow protection. Thus, the production of areas with different surface energies (for achieving overflow protection) are not needed and thus costs are low. Also for an OLED structural element using the display device according to an embodiment of the present invention, the quantity of materials not immediately serving the purpose of light generation is reduced.

Photo-resists may degasify during the usage of OLED structural elements and the degasifying products may reduce the life times of the OLED display elements. However, the low barrier height (profile height), produced by embodiments to the present invention reduces the volume of photo-resist used. Consequently, an amount of degasifying products is also reduced. Thus, the lifetime of the OLED structural elements can be prolonged. Furthermore, since the absolute height of the barriers is short, cathode deposition on the barrier structure can be avoided or reduced. This results in a more homogenous formation of a cathode film (which is deposited in a follow-up process step during the production of an OLED structural element) and, subsequently, to a significantly lower electrical resistance which has a positive effect on the energy balance of the display element.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat display device, comprising:
a substrate;
a first electrode on the substrate;
a second electrode above the first electrode;
a pixel region comprising a light emitting layer interposed between the first electrode and the second electrode; and
barriers formed on the substrate at a periphery portion of the pixel region and with at least one layer, each of the barriers having a groove formed in at least one side thereof, the groove being arranged between adjacent first electrodes,
wherein the groove has a depth less than 0.1 μm.

2. The device of claim 1, wherein the grooves have a striped pattern.

3. The device of claim 2, wherein neighboring pixel regions are separated by the barriers with the grooves and include different light-emitting layers.

4. The device of claim 3, wherein the barriers surround one or more pixel regions.

5. The device of claim 1, wherein the barrier is formed from a photo-resist.

6. The device of claim 5, wherein the photo-resist in an inkjet printing substrate is composed of a material selected from the group consisting of a Novolak basis, an acrylic laquer, an epoxy laquer, and a polyamide laquer.

7. The device of claim 1, wherein the barrier has a height less than 1 μm.

8. The device of claim 1, wherein the light-emitting portion further comprises a charge carrier layer interposed between either the first electrode layer and the light-emitting layer or the light-emitting layer and the second electrode layer.

9. The device of claim 1, wherein the barriers are formed such that neighboring pixels are symmetrical about each of the barriers.

10. The device of claim 9, wherein the groove is arranged in the middle of the barrier.

11. The device of claim 1, wherein the substrate is composed of a material selected from the group consisting of glass, a synthetic material, and silicon.

12. The device of claim 1, wherein the barrier comprises:
a first barrier layer neighboring the first electrode layer and defining the pixel regions;
a second barrier layer having the groove formed thereon.

13. The device of claim 12, wherein the second barrier layer is formed of a photo-resist.

14. The device of claim 13, wherein, the photo-resist is composed of a material selected from the group of a conventional photo-resist on a Novolak basis, an acrylic laquer, an epoxy laquer, or a polyamid laquer.

15. The device of claim 1, wherein the light-emitting portion is an organic electroluminescent portion.

16. A flat display device, comprising:
a substrate;
a first electrode on the substrate;

a second electrode above the first electrode;

a pixel region comprising a light emitting layer interposed between the first electrode and the second electrode; and barriers formed on a periphery portion of the pixel region and with at least one layer, each of the barriers having a groove formed in at least one side thereof, wherein the grooves have a mesh pattern and have a depth less than 0.1 µm.

17. The device of claim 16, wherein at least one of the pixel regions is surrounded by identical mesh grooves and includes light-emitting layers emitting identical colors.

18. A flat display device, comprising:

a substrate;

a first electrode on the substrate;

a second electrode above the first electrode;

a pixel region comprising a light emitting layer interposed between the first electrode and the second electrode; and barriers formed on a periphery portion of the pixel region and with at least one layer, each of the barriers having a groove formed on at least one side thereof, wherein the groove has a depth of less than 0.1 µm.

* * * * *